(12) United States Patent
Oshima et al.

(10) Patent No.: US 8,975,648 B2
(45) Date of Patent: Mar. 10, 2015

(54) LIGHT EMITTING DEVICE AND MANUFACTURING METHOD THEREOF

(75) Inventors: Yukitoyo Oshima, Gifu (JP); Takehito Hirose, Gifu (JP); Tadashi Kato, Aichi (JP); Yurika Ishihara, Aichi (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 13/021,166

(22) Filed: Feb. 4, 2011

(65) Prior Publication Data
US 2011/0193118 A1 Aug. 11, 2011

(30) Foreign Application Priority Data

Feb. 9, 2010 (JP) ................................ P2010-026580
Dec. 9, 2010 (JP) ................................ P2010-274283

(51) Int. Cl.
| | |
|---|---|
| *H01L 33/00* | (2010.01) |
| *H01L 33/56* | (2010.01) |
| *H01L 23/00* | (2006.01) |
| *B29C 45/14* | (2006.01) |
| *B29C 45/16* | (2006.01) |
| *H01L 33/50* | (2010.01) |

(52) U.S. Cl.
CPC .............. *H01L 33/56* (2013.01); *H01L 24/97* (2013.01); *B29C 45/14655* (2013.01); *B29C 45/1671* (2013.01); *B29K 2995/0026* (2013.01); *B29K 2995/0031* (2013.01); *H01L 33/507* (2013.01); *H01L 2933/0041* (2013.01); *H01L 2933/005* (2013.01); *H01L 2224/48091* (2013.01); *H01L 2924/1815* (2013.01)
USPC ........ 257/98; 257/99; 257/100; 257/E33.059; 257/E33.061; 257/E33.073

(58) Field of Classification Search
None
See application file for complete search history.

(56) References Cited

U.S. PATENT DOCUMENTS

| | | | | |
|---|---|---|---|---|
| 6,120,600 | A * | 9/2000 | Edmond et al. ................. | 117/89 |
| 6,717,362 | B1 * | 4/2004 | Lee et al. ....................... | 313/512 |
| 6,791,116 | B2 * | 9/2004 | Takahashi et al. .............. | 257/79 |
| 6,982,522 | B2 * | 1/2006 | Omoto .......................... | 313/502 |
| 7,388,232 | B2 * | 6/2008 | Suehiro et al. .................. | 257/98 |
| 7,868,343 | B2 * | 1/2011 | Negley et al. ................... | 257/99 |
| 8,232,578 | B2 * | 7/2012 | Takeda et al. .................. | 257/100 |
| 8,283,675 | B2 * | 10/2012 | Ohta et al. ...................... | 257/79 |
| 8,294,165 | B2 * | 10/2012 | Hattori et al. .................. | 257/98 |
| 8,324,641 | B2 * | 12/2012 | Yan et al. ........................ | 257/98 |
| 2004/0169466 | A1 * | 9/2004 | Suehiro et al. ................. | 313/512 |
| 2005/0224829 | A1 * | 10/2005 | Negley et al. ................... | 257/99 |
| 2006/0186431 | A1 * | 8/2006 | Miki et al. ..................... | 257/100 |

(Continued)

FOREIGN PATENT DOCUMENTS

| | | |
|---|---|---|
| JP | 2007-116131 | 5/2007 |
| JP | 2007-274010 | 10/2007 |
| JP | 2008-10749 | 1/2008 |

*Primary Examiner* — Hoang-Quan Ho
(74) *Attorney, Agent, or Firm* — Finnegan, Henderson, Farabow, Garrett & Dunner, L.L.P.

(57) ABSTRACT

A light emitting device includes a first resin layer which is made of transparent resin and provided outside a solid-state light-emitting element mounted on a mounting substrate; and a second resin layer which is provided outside the first resin layer and made of transparent resin that contains a phosphor which is excited with a luminescence wavelength of the solid-state light-emitting element, wherein when the refractive index of the solid-state light-emitting element is set to be N1, the refractive index of the first resin layer is set to be N2, and the refractive index of the second resin layer is set to be N3, the relationship of N1≥N2≥N3≥1 is established.

3 Claims, 12 Drawing Sheets

(56) References Cited

U.S. PATENT DOCUMENTS

| | | | |
|---|---|---|---|
| 2007/0034883 A1* | 2/2007 | Ohba | 257/85 |
| 2007/0096113 A1 | 5/2007 | Inoshita et al. | |
| 2007/0228390 A1* | 10/2007 | Hattori et al. | 257/79 |
| 2008/0079182 A1* | 4/2008 | Thompson et al. | 264/1.9 |
| 2008/0088226 A1* | 4/2008 | Sohn et al. | 313/503 |
| 2008/0203415 A1* | 8/2008 | Thompson et al. | 257/98 |
| 2009/0001390 A1* | 1/2009 | Yan et al. | 257/89 |
| 2009/0008662 A1* | 1/2009 | Ashdown et al. | 257/98 |
| 2009/0085458 A1* | 4/2009 | Murazaki et al. | 313/487 |
| 2009/0321758 A1* | 12/2009 | Liu et al. | 257/98 |
| 2010/0052006 A1* | 3/2010 | Takeda et al. | 257/100 |
| 2010/0090234 A1* | 4/2010 | Cho et al. | 257/95 |
| 2010/0163914 A1* | 7/2010 | Urano | 257/98 |
| 2010/0181582 A1* | 7/2010 | Li et al. | 257/91 |
| 2011/0089453 A1* | 4/2011 | Min | 257/98 |

\* cited by examiner

LIGHT EMITTING DEVICE AND MANUFACTURING METHOD THEREOF

BACKGROUND OF THE INVENTION

1. Field of the Invention

The present invention relates to a light emitting device and a manufacturing method thereof and in particular, to a light emitting device or the like, which uses a solid-state light-emitting element such as a light emitting diode.

2. Description of the Related Art

In the past, a light emitting device using a solid-state light-emitting element, for example, a light emitting diode has been proposed. As this type of light emitting device, a device obtaining white light in a pseudo manner has been proposed. The light emitting device which emits white light in this manner can be used as, for example, a light source for a backlight of a liquid crystal display device, a light source for lighting, or the like.

For example, in Japanese Unexamined Patent Application Publication No. 2008-010749, Japanese Unexamined Patent Application Publication No. 2007-116131, Japanese Unexamined Patent Application Publication No. 2007-274010, and the like, light emitting devices are described in which a phosphor layer that contains a phosphor which is excited with the luminescence wavelength of a light emitting diode is provided outside the light emitting diode and white light can be obtained in a pseudo manner by combination of luminescence (excitation light) of the light emitting diode and luminescence (wavelength conversion light) from the phosphor.

The light emitting devices described in Japanese Unexamined Patent Application Publication No. 2008-010749, Japanese Unexamined Patent Application Publication No. 2007-116131, Japanese Unexamined Patent Application Publication No. 2007-274010, and the like each have a multilayer structure, in which the outside of the light emitting diode is three layers or more, whereby a manufacturing process is complicated, thereby becoming a factor for an increase in cost. Also, the light emitting devices described in Japanese Unexamined Patent Application Publication No. 2008-010749, Japanese Unexamined Patent Application Publication No. 2007-116131, Japanese Unexamined Patent Application Publication No. 2007-274010, and the like each have a multilayer structure, in which the outside of the light emitting diode is three layers or more, whereby the more the number of layers, the more light extraction efficiency is reduced.

SUMMARY OF THE INVENTION

It is desirable to attain a reduction in cost by making a manufacturing process simple. Also, it is desirable to increase light extraction efficiency.

According to an embodiment of the present invention, there is provided a light emitting device including: a first resin layer which is made of transparent resin and provided outside a solid-state light-emitting element mounted on a mounting substrate; and a second resin layer which is provided outside the first resin layer and made of transparent resin that contains a phosphor which is excited with a luminescence wavelength of the solid-state light-emitting element, wherein when the refractive index of the solid-state light-emitting element is set to be N1, the refractive index of the first resin layer is set to be N2, and the refractive index of the second resin layer is set to be N3, the relationship of $N1 \geq N2 \geq N3 \geq 1$ is established.

In the embodiment of the invention, the solid-state light-emitting element, for example, a light emitting diode is mounted on the mounting substrate. The first resin layer made of transparent resin is provided outside the solid-state light-emitting element and the second resin layer is provided outside the first resin layer. The second resin layer is made of transparent resin that contains a phosphor which is excited with the luminescence wavelength of the solid-state light-emitting element.

In this case, some of light emitted from the solid-state light-emitting element is output to the outside through the first resin layer and the second resin layer. Also, some other light emitted from the solid-state light-emitting element is input to the second resin layer through the first resin layer, thereby exciting the phosphor in the second resin layer. Then, light emitted from the phosphor is output from the second resin layer to the outside. For example, when the light emitting diode is a blue light emitting diode and the phosphor is a phosphor which is excited by the blue light emitting diode, for example, a phosphor of a YAG system, a silicate system, or the like, it becomes possible to obtain white light in a pseudo manner by combination of the luminescence of the light emitting diode and the luminescence from the phosphor.

Here, a relationship between the refractive index N1 of the solid-state light-emitting element, the refractive index N2 of the first resin layer, and the refractive index N3 of the second resin layer is set to be the relationship of $N1 \geq N2 \geq N3 \geq 1$, so that the luminescence of the solid-state light-emitting element and the luminescence of the phosphor in the second resin layer are efficiently extracted to the outside.

In this manner, in the embodiment of the invention, since the outside of the solid-state light-emitting element is two layers, a manufacturing process is simplified compared to the existing structure having three layers or more, so that a reduction in cost can be attained and it becomes possible to increase light extraction efficiency.

In the embodiment of the invention, for example, the first resin layer and the second resin layer may each have a convex portion which encloses the solid-state light-emitting element, and a thin-film portion which is connected to the convex portion and located around the convex portion. In this case, light emitted from the solid-state light-emitting element and light emitted from the phosphor in the second resin layer are also output from the thin-film portion to the outside, in addition to being output from the convex portion to the outside. For this reason, light can be output from the entire surface and also improvement in luminance can be attained.

In the embodiment of the invention, for example, the light emitting device may further include a thin-film portion which is provided corresponding to a portion or the entirety between the mounting substrate and the first resin layer and made of transparent resin that contains a phosphor which is excited with the luminescence wavelength of the solid-state light-emitting element. In this case, of light emitted from the solid-state light-emitting element, light toward the substrate is input to the thin-film portion through the first resin layer, thereby exciting the phosphor in the thin-film portion. Then, some of light emitted from the phosphor is output to the outside through the first resin layer and the second resin layer. For this reason, an improvement in luminance can be attained.

According to another embodiment of the present invention, there is provided a method of manufacturing a light emitting device, including the steps of: applying a water-repellent material to a surface of a mounting substrate with a solid-state light-emitting element mounted, on which the solid-state light-emitting element is mounted, so as to surround the solid-state light-emitting element; forming a first resin layer with a dome shape outside the solid-state light-emitting element by applying transparent resin to the outside of the solid-state light-emitting element; and forming a second resin layer with a dome shape outside the first resin layer by applying transparent resin that contains a phosphor which is excited with a luminescence wavelength of the solid-state light-emitting element, to the outside of the first resin layer.

In this embodiment of the invention, first, a water-repellent material containing, for example, fluorine as its constituent is applied to the surface of the mounting substrate with the solid-state light-emitting element mounted, on which the solid-state light-emitting element is mounted, so as to surround the solid-state light-emitting element. The water-repellent material is applied in this manner, whereby it becomes possible to manufacture the first resin layer and the second resin layer by a potting method as follows.

Next, transparent resin is applied outside the solid-state light-emitting element, so that the first resin layer with a dome shape is formed outside the solid-state light-emitting element. In this case, the transparent resin applied outside the solid-state light-emitting element is shaped into a polka dot shape due to the water repellent effect of the water-repellent material. The transparent resin is, for example, a thermosetting resin and is solidified by application of heat, so that a lens mechanism with a dome shape (convex shape) which encloses the solid-state light-emitting element is formed as the first resin layer.

Next, transparent resin which contains a phosphor is applied outside the first resin layer, so that the second resin layer with a dome shape is formed outside the first resin layer. In this case, the transparent resin applied outside the first resin layer is shaped into a polka dot shape due to the water repellent effect of the water-repellent material. The transparent resin is also, for example, a thermosetting resin and is solidified by application of heat, so that a lens mechanism of a convex shape which encloses the solid-state light-emitting element and the first resin layer is formed as the second resin layer.

In this manner, in the embodiment of the invention, the light emitting device having a structure in which the first resin layer made of transparent resin and the second resin layer made of transparent resin that contains a phosphor which is excited with the luminescence wavelength of the solid-state light-emitting element are sequentially provided outside the solid-state light-emitting element mounted on the mounting substrate can be simply manufactured, so that a reduction in cost can be attained.

According to another further embodiment of the present invention, there is provided a method of manufacturing a light emitting device, including the steps of: forming a first resin layer made of transparent resin outside a solid-state light-emitting element mounted on a mounting substrate, by using a mold; and forming a second resin layer made of transparent resin that contains a phosphor which is excited with a luminescence wavelength of the solid-state light-emitting element, outside the first resin layer by using a mold.

In the embodiment of the invention, first, the first resin layer made of transparent resin is formed outside the solid-state light-emitting element mounted on the mounting substrate by using a mold. The transparent resin is, for example, a thermosetting resin and is solidified by application of heat, so that a lens mechanism of a convex shape which encloses, for example, the solid-state light-emitting element is formed as the first resin layer.

Next, the second resin layer made of transparent resin that contains a phosphor which is excited with the luminescence wavelength of the solid-state light-emitting element is formed outside the first resin layer by using a mold. The transparent resin is also, for example, a thermosetting resin and is solidified by application of heat, so that a lens mechanism of a convex shape which encloses, for example, the solid-state light-emitting element and the first resin layer is formed as the second resin layer.

In this manner, in the embodiment of the invention, the light emitting device having a structure in which the first resin layer made of transparent resin and the second resin layer made of transparent resin that contains a phosphor which is excited with the luminescence wavelength of the solid-state light-emitting element are sequentially provided outside the solid-state light-emitting element mounted on the mounting substrate can be simply manufactured, so that a reduction in cost can be attained.

According to the light emitting device according to an embodiment of the invention, since the outside of the solid-state light-emitting element is two layers, a manufacturing process is simplified compared to the existing structure having three layers or more, so that a reduction in cost can be attained and it becomes possible to increase light extraction efficiency. Also, according to the manufacturing method of a light emitting device according to an embodiment of the invention, the light emitting device having a structure in which the first resin layer made of transparent resin and the second resin layer made of transparent resin that contains a phosphor which is excited with the luminescence wavelength of the solid-state light-emitting element are sequentially provided outside the solid-state light-emitting element mounted on the mounting substrate can be simply manufactured, so that a reduction in cost can be attained.

DESCRIPTION OF THE PREFERRED EMBODIMENTS

Hereinafter, modes for carrying out the invention (hereinafter referred to as "embodiments") will be described. In addition, description will be performed in the following order.
1. First Embodiment
2. Second Embodiment
3. Third Embodiment
4. Fourth Embodiment
5. Modified Example

1. First Embodiment

Configuration of Light Emitting Device

Figure 1:
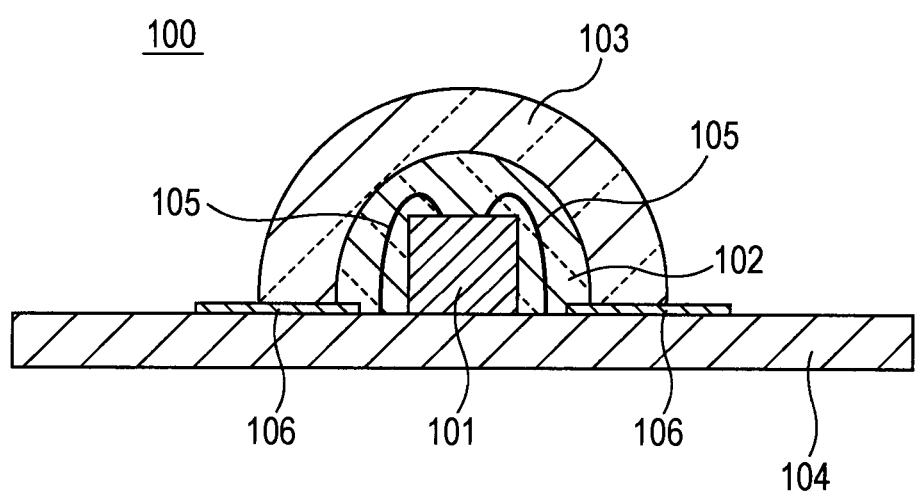
FIG. 1 is a diagram schematically illustrating a structural example of a light emitting device according to a first embodiment of the invention.

FIG. 1 shows a structural example of a light emitting device 100 according to a first embodiment. The light emitting device 100 includes a light emitting diode (LED) 101 as a solid-state light-emitting element, a transparent resin layer 102 as a first resin layer, and a transparent resin layer 103 as a second resin layer.

The light emitting diode 101 is mounted on a circuit substrate 104 as a mounting substrate. Electrodes of the light emitting diode 101 are connected to conductors on the circuit substrate 104 by using wires 105. The transparent resin layer 102 is made of transparent resin. The transparent resin layer 102 is provided outside the light emitting diode 101 so as to cover the light emitting diode 101. The transparent resin layer 102 is formed into a dome shape and constitutes a lens mechanism of a convex shape, which encloses the light emitting diode 101.

The transparent resin layer 103 is made of transparent resin that contains a phosphor which is excited with the luminescence wavelength of the light emitting diode 101. The transparent resin layer 103 is provided outside the transparent resin layer 102 so as to cover the transparent resin layer 102. The transparent resin layer 103 is formed into a dome shape, similarly to the transparent resin layer 102, and constitutes a lens mechanism of a convex shape, which encloses the light emitting diode 101 and the transparent resin layer 102. In this embodiment, in order to obtain white light in a pseudo manner, for example, the light emitting diode 101 is set to be a blue light emitting diode and the phosphor is set to be a phosphor of a YAG (yttrium aluminum garnet) system.

To a contact portion of the circuit substrate 104 with the above-described transparent resin layers 102 and 103, a water-repellent material 106 is applied. The water-repellent material 106 contains, for example, fluorine as its constituent. As will be described later, in the light emitting device 100, the transparent resin layers 102 and 103 are formed by a potting method. The water-repellent material 106 is applied in order to secure formability of the transparent resin layers 102 and 103.

In addition, in the light emitting device 100 shown in FIG. 1, a relationship between the refractive indexes of the light emitting diode 101 and the transparent resin layers 102 and 103 is set as follows. That is, when the refractive index of the light emitting diode 101 is set to be N1, the refractive index of the transparent resin layer 102 is set to be N2, and the refractive index of the transparent resin layer 103 is set to be N3, the relationship is set so as to satisfy the relationship of $N1 \geq N2 \geq N3 \geq 1$.

Manufacturing Method of Light Emitting Device

Figure 2A:
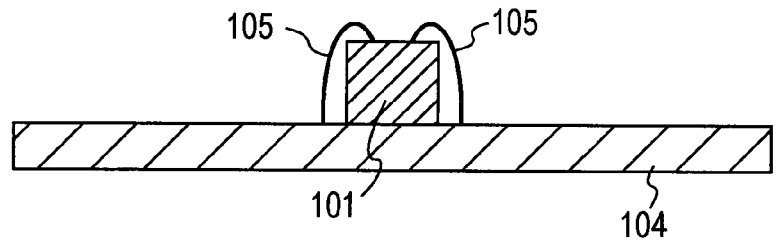
FIGS. 2A to 2D are diagrams for illustrating a manufacturing process of the light emitting device according to the first embodiment of the invention.
Figure 2B:
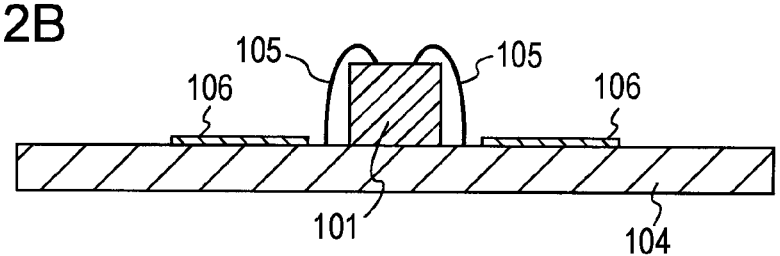

A manufacturing process of the light emitting device 100 shown in FIG. 1 will be described with reference to FIGS. 2A to 2D. First, as shown in FIG. 2A, the circuit substrate 104 with the light emitting diode 101 mounted thereon is prepared. Next, as shown in FIG. 2B, the water-repellent material 106 is applied to the surface of the circuit substrate 104, on which the light emitting diode 101 is mounted, so as to surround the light emitting diode 101. In this case, although illustration is omitted, the applied area of the water-repellent material 106 becomes, for example, a doughnut-shaped region centered on the light emitting diode 101.

Figure 2C:
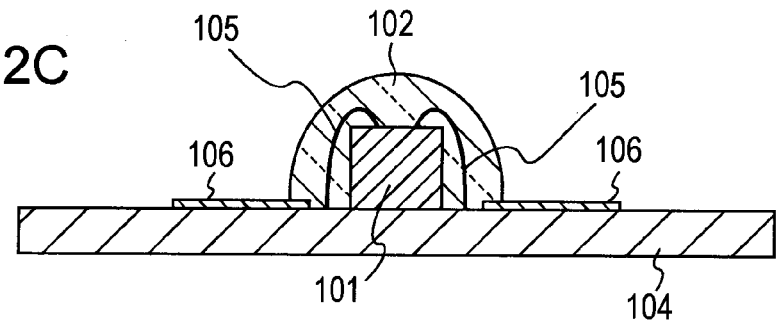

Next, as shown in FIG. 2C, transparent resin is applied outside the light emitting diode 101. In this case, the transparent resin is shaped into a polka dot shape due to the water repellent effect of the water-repellent material 106. The transparent resin is, for example, a thermosetting resin and is solidified by application of heat. As a result, the transparent resin layer 102 with a dome shape, which constitutes a lens mechanism of a convex shape, is formed outside the light emitting diode 101.

Figure 2D:
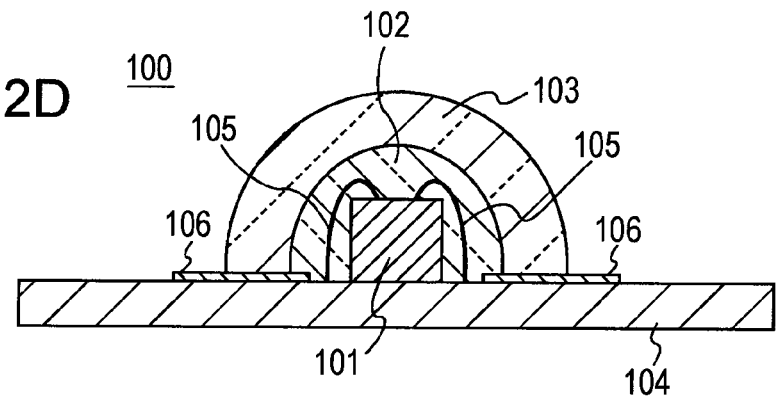

Next, as shown in FIG. 2D, transparent resin that contains a phosphor which is excited with the luminescence wavelength of the light emitting diode 101 is applied outside the transparent resin layer 102. In this case, the transparent resin is shaped into a polka dot shape due to the water repellent effect of the water-repellent material 106. The transparent resin is, for example, a thermosetting resin and is solidified by application of heat. As a result, the transparent resin layer 103 with a dome shape, which constitutes a lens mechanism of a convex shape, is formed outside the transparent resin layer 102, so that the light emitting device 100 is completed.

Figure 3:
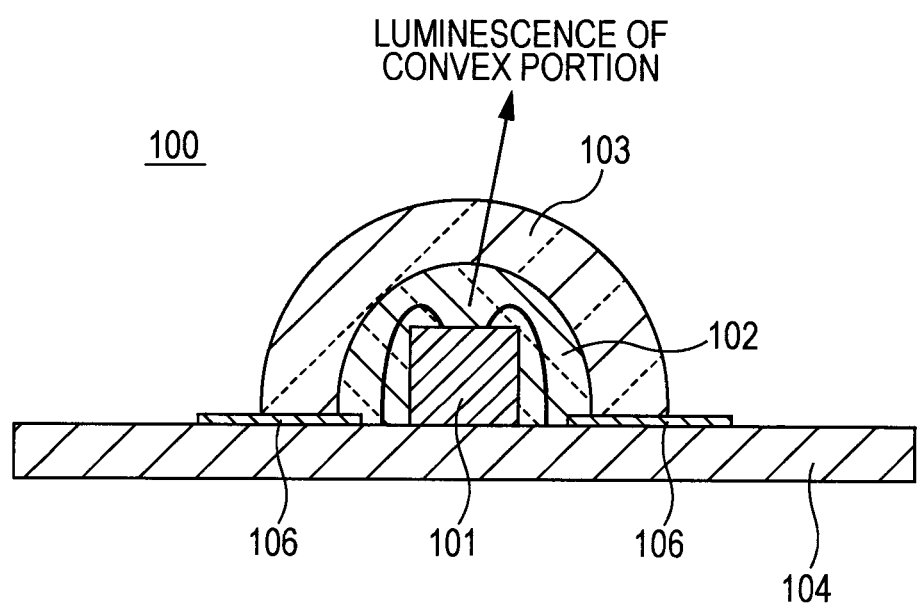
FIG. 3 is a diagram for illustrating a light output operation of the light emitting device according to the first embodiment of the invention.

In the light emitting device 100 shown in FIG. 1, as shown in FIG. 3, light is output from convex portions of the transparent resin layers 102 and 103 which enclose the light emitting diode 101. In this case, some of the light emitted from the light emitting diode 101 is output to the outside through the transparent resin layer 102 and the transparent resin layer 103. Also, some other light emitted from the light emitting diode 101 is input to the transparent resin layer 103 through the transparent resin layer 102, thereby exciting the phosphor in the transparent resin layer 103.

Then, light emitted from the phosphor in the transparent resin layer 103 is output from the transparent resin layer 103 to the outside. As described above, since the light emitting diode 101 is the blue light emitting diode and the phosphor in the transparent resin layer 103 is the phosphor of a YAG system, white light can be obtained in a pseudo manner by combination of the luminescence of the light emitting diode 101 and the luminescence from the phosphor. In this case, the relationship between the refractive index N1 of the light emitting diode 101, the refractive index N2 of the transparent resin layer 102, and the refractive index N3 of the transparent resin layer 103 is set to be the relationship of $N1 \geq N2 \geq N3 \geq 1$. For this reason, the luminescence of the light emitting diode 101 and the luminescence of the phosphor in the transparent resin layer 103 are efficiently extracted to the outside.

In the light emitting device 100 shown in FIG. 1, since the outside of the light emitting diode 101 is two layers, the manufacturing process can be simplified compared to the existing structure having three layers or more, so that a reduction in cost can be attained. Also, in the light emitting device 100 shown in FIG. 1, since the outside of the light emitting diode 101 is two layers, attenuation of light can be suppressed compared to the existing structure having three layers or more, so that it is possible to increase light extraction efficiency. Since the light emitting device 100 shown in FIG. 1 emits light only from the convex portion, as described above, it can be used as, for example, a light source for a backlight of a liquid crystal display device, or the like.

Figure 4:
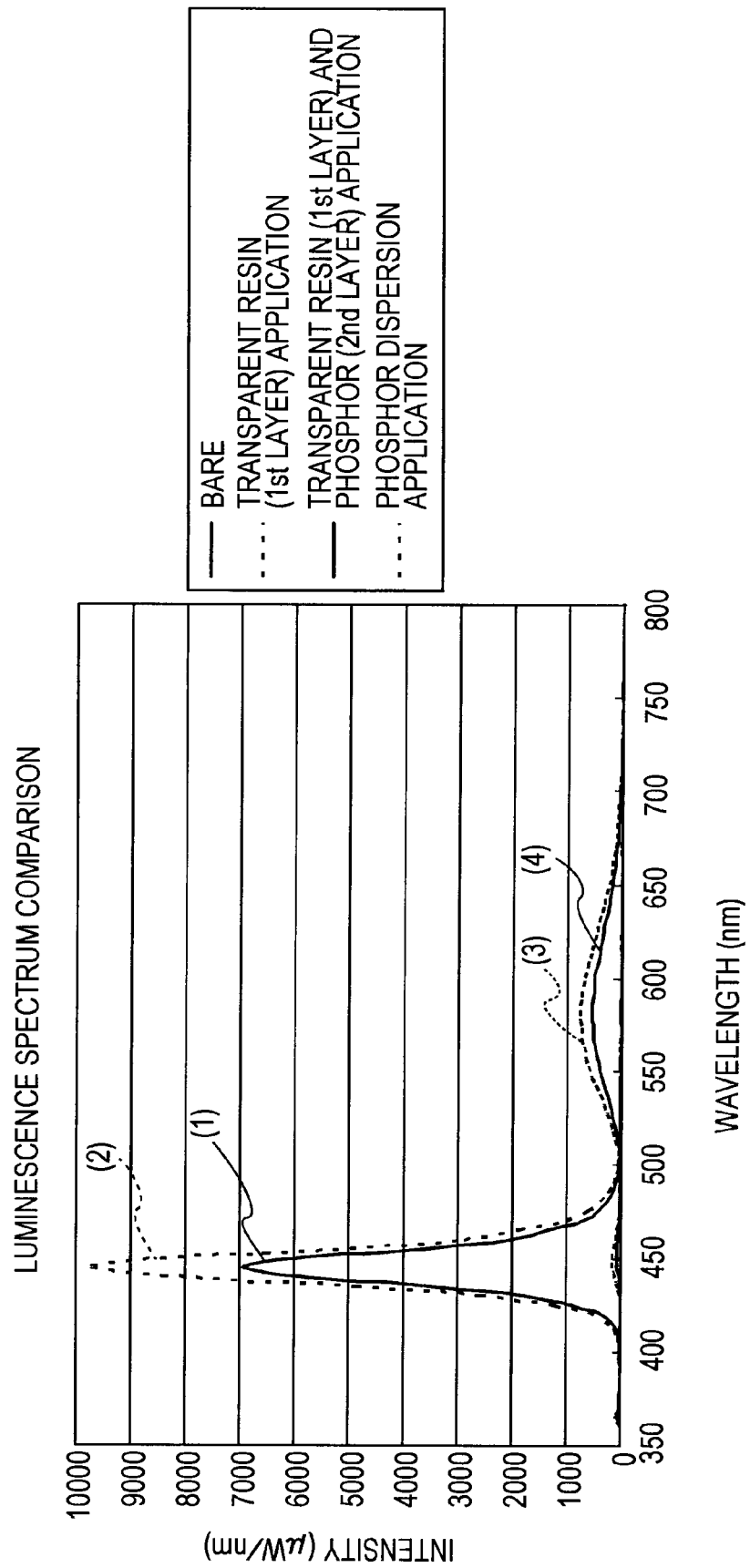
FIG. 4 is a diagram illustrating examples of luminescence intensity and a luminescence wavelength in several kinds of structures which include the light emitting device according to the first embodiment of the invention.

FIG. 4 shows luminescence intensity and a luminescence wavelength in the cases of the following (1) to (4).

(1) A case where light emission is performed in a state where only the light emitting diode 101 is mounted on the circuit substrate 104 (refer to FIG. 2A).

(2) A case where light emission is performed in a state where the light emitting diode 101 is mounted on the circuit substrate 104 and the transparent resin layer 102 is formed outside the light emitting diode 101 (refer to FIG. 2C).

(3) A case where light emission is performed in a state where the light emitting diode 101 is mounted on the circuit substrate 104, the transparent resin layer 102 is formed outside the light emitting diode 101, and the transparent resin layer 103 that contains a phosphor is formed outside the transparent resin layer 102 (refer to FIGS. 1 and 2D).

Figure 5:
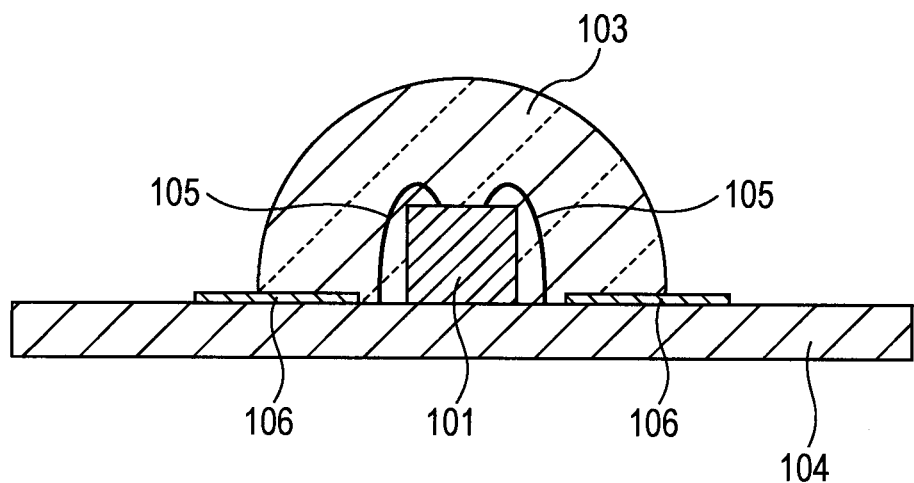
FIG. 5 is a diagram illustrating a light emitting device having a structure in which a transparent resin layer that contains a phosphor is formed directly outside a light emitting diode.

(4) A case where light emission is performed in a state where the light emitting diode 101 is mounted on the circuit substrate 104 and the transparent resin layer 103 that contains a phosphor is formed directly outside the light emitting diode 101 (refer to FIG. 5).

In the case of the above (1), only light (blue light) with a wavelength of around 450 nm to 470 nm from the light emitting diode 101 is output to the outside. In the case of the above (2), only light (blue light) with a wavelength of around 450 nm to 470 nm from the light emitting diode 101 is output to the outside, similarly to the case of the above (1). In this case, since the light emitting diode 101 is covered by the transparent resin layer 102 having a refractive index lower than that of the light emitting diode 101, light extraction efficiency becomes higher compared to the case of the above (1), so that luminescence intensity increases.

In the case of the above (4), light (blue light) with a wavelength of around 450 nm to 470 nm from the light emitting diode 101 and light (light from red to green) with a wavelength of around 570 nm to 580 nm from the phosphor are output to the outside, so that white light can be obtained in a pseudo manner. In this case, the outside of the light emitting diode 101 is directly covered by the transparent resin layer 103 that contains the phosphor. For this reason, the intensity of light which is input from the light emitting diode 101 to the transparent resin layer 103 is weak (refer to the case of the above (1)), so that the intensity of output light (white light) also weakens.

In the case of the above (3), similarly to the case of the above (4), light (blue light) with a wavelength of around 450 nm to 470 nm from the light emitting diode 101 and light (light from red to green) with a wavelength of around 570 nm to 580 nm from the phosphor are output to the outside, so that white light can be obtained in a pseudo manner. In this case, the outside of the light emitting diode 101 is first covered by the transparent resin layer 102 and the outside thereof is in turn covered by the transparent resin layer 103 that contains the phosphor. For this reason, the intensity of light which is input from the light emitting diode 101 to the transparent resin layer 103 is strong compared to the case of the above (4) (refer to the case of the above (2)), so that the intensity of output light (white light) also becomes stronger. That is, in the case of the above (3), the luminance of white light increases compared to the case of the above (4).

2. Second Embodiment

Configuration of Light Emitting Device

Figure 6:
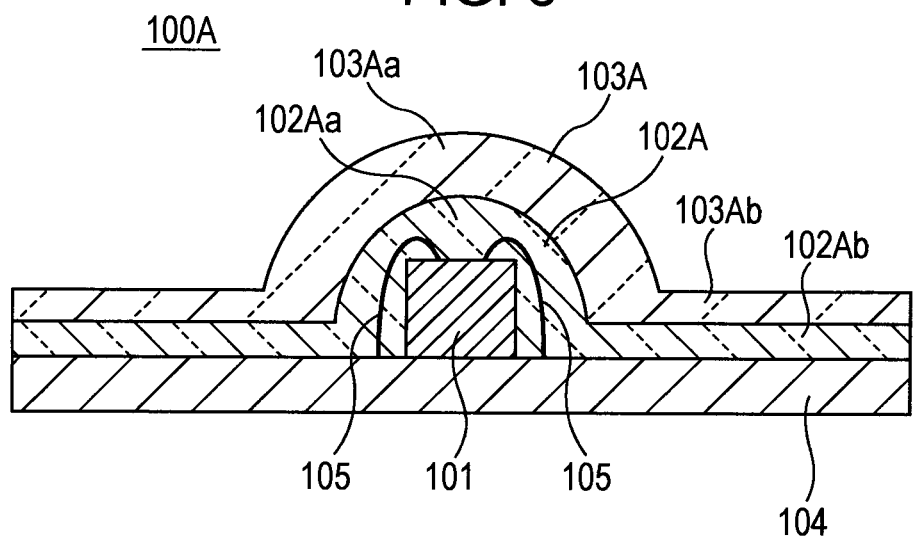
FIG. 6 is a diagram schematically illustrating a structural example of a light emitting device according to a second embodiment of the invention.

FIG. 6 shows a structural example of a light emitting device 100A according to a second embodiment. In FIG. 6, the same reference numeral is applied to a portion corresponding to that of FIG. 1 and the detailed description thereof will be appropriately omitted. The light emitting device 100A includes the light emitting diode (LED) 101 as the solid-state light-emitting element, a transparent resin layer 102A as the first resin layer, and a transparent resin layer 103A as the second resin layer.

The light emitting diode 101 is mounted on the circuit substrate 104 as the mounting substrate. The electrodes of the light emitting diode 101 are connected to conductors on the circuit substrate 104 by using the wires 105.

The transparent resin layer 102A is made of transparent resin. The transparent resin layer 102A is provided outside the light emitting diode 101 so as to cover the light emitting diode 101. The transparent resin layer 102A has a convex portion 102Aa which encloses the light emitting diode 101, and a thin-film portion 102Ab which is connected to the convex portion 102Aa and is located around the convex portion 102Aa. The convex portion 102Aa of the transparent resin layer 102A is formed into a dome shape and constitutes a lens mechanism of a convex shape.

The transparent resin layer 103A is made of transparent resin that contains a phosphor which is excited with the luminescence wavelength of the light emitting diode 101. The transparent resin layer 103A is provided outside the transparent resin layer 102A so as to cover the transparent resin layer 102A. The transparent resin layer 103A has a convex portion 103Aa which encloses the light emitting diode 101, and a thin-film portion 103Ab which is connected to the convex portion 103Aa and is located around the convex portion 103Aa. The convex portion 103Aa of the transparent resin layer 103A is formed into a dome shape and constitutes a lens mechanism of a convex shape.

In this embodiment, in order to obtain white-light in a pseudo manner, for example, the light emitting diode 101 is set to be a blue light emitting diode and the phosphor which is contained in the transparent resin layer 103A is set to be a phosphor of a YAG (yttrium aluminum garnet) system.

In addition, in the light emitting device 100A shown in FIG. 6, the relationship between the refractive indexes of the light emitting diode 101 and the transparent resin layers 102A and 103A is set as follows. That is, when the refractive index of the light emitting diode 101 is set to be N1, the refractive index of the transparent resin layer 102A is set to be N2, and the refractive index of the transparent resin layer 103A is set to be N3, the relationship is set so as to satisfy the relationship of $N1 \geq N2 \geq N3 \geq 1$.

Manufacturing Method of Light Emitting Device

Figure 7A:
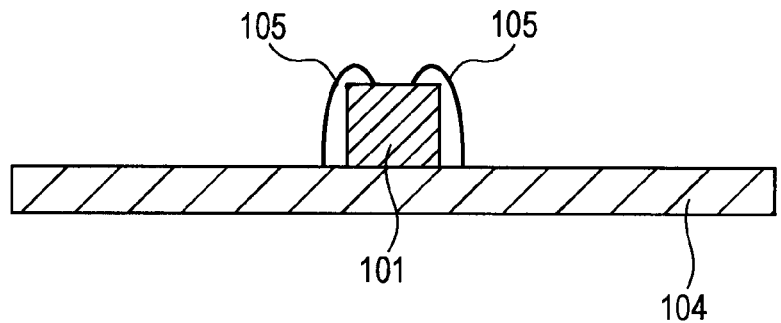
FIGS. 7A to 7C are diagrams for illustrating a manufacturing process of the light emitting device according to the second embodiment of the invention.
Figure 7B:
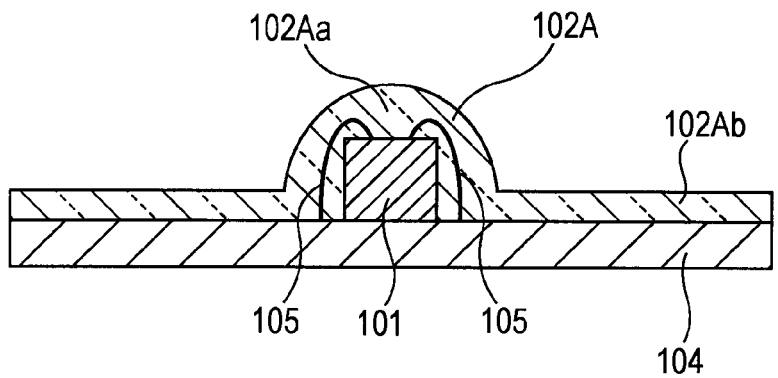
Figure 7C:
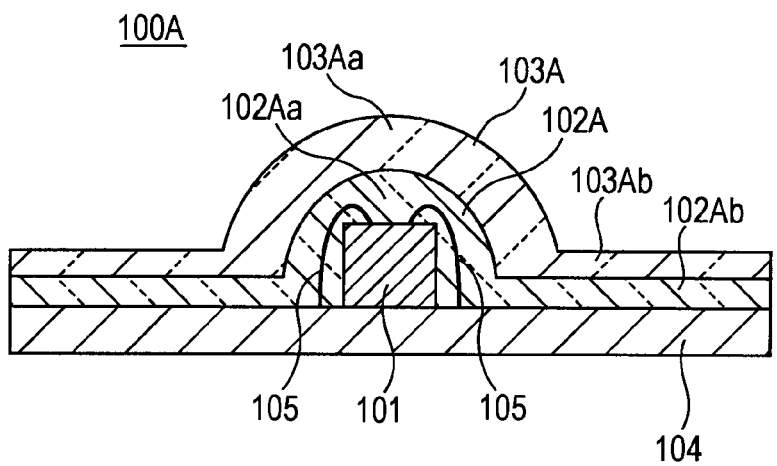

A manufacturing process of the light emitting device 100A shown in FIG. 6 will be described with reference to FIGS. 7A to 7C. First, as shown in FIG. 7A, the circuit substrate 104 with the light emitting diode 101 mounted thereon is prepared. Next, as shown in FIG. 7B, the transparent resin layer 102A having the convex portion 102Aa and the thin-film portion 102Ab is formed outside the light emitting diode 101 by a compression molding method.

Figure 8A:
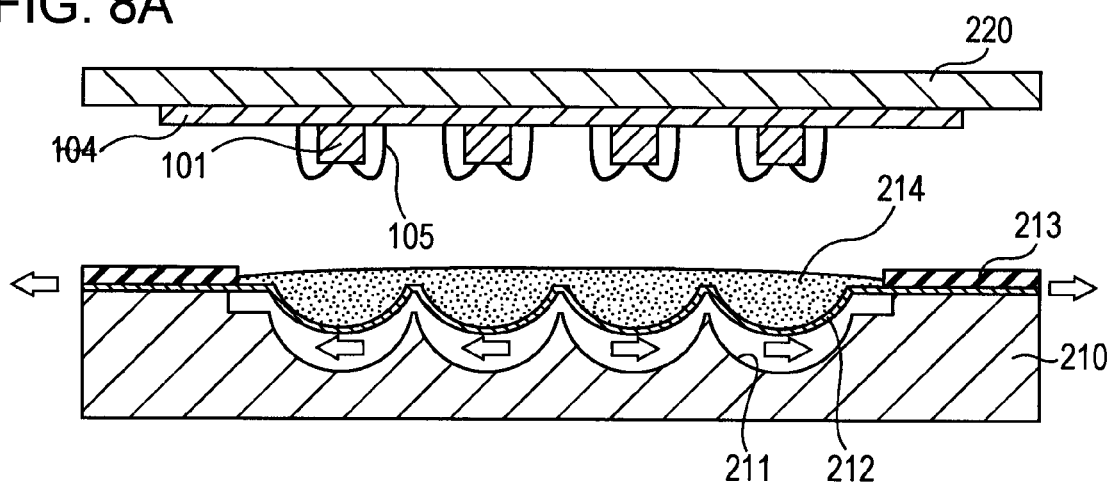
FIGS. 8A to 8C are diagrams illustrating one example of a manufacturing process of a transparent resin layer (a first layer) of the light emitting device according to the second embodiment of the invention.

One example of a manufacturing process of the transparent resin layer 102A will be described with reference to FIGS. 8A to 8C. As shown in FIG. 8A, a lower mold 210 having a concave portion 211 corresponding to the convex portion 102Aa of the transparent resin layer 102A and a flat plate-like upper mold 220 are used.

First, as shown in FIG. 8A, thermosetting transparent liquid resin 214 is placed above the lower mold 210 with a release sheet 212 interposed therebetween. In addition, an O-ring 213 for preventing the above-described transparent liquid resin 214 from being leaked to the outside is disposed above the lower mold 210. In this state, the release sheet 212 is pulled in an outer circumference direction, as shown in an arrow, and placed in a tense state. Also, as shown in FIG. 8A, the circuit substrate 104 with the light emitting diode 101 mounted thereon is fixed to the upper mold 220.

Figure 8B:
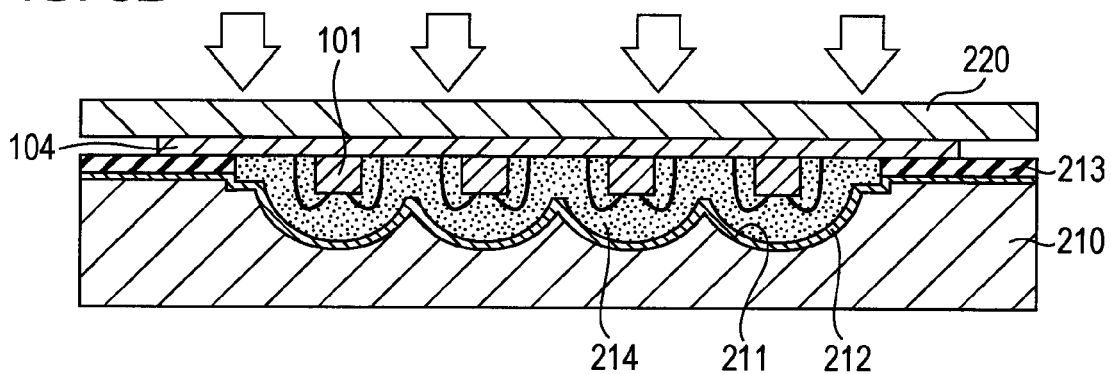

Next, as shown in FIG. 8B, the upper mold 220 is moved so as to approach the lower mold 210, so that the light emitting diode 101 mounted on the circuit substrate 104 is in a state where the light emitting diode 101 is located in the concave portion 211 of the lower mold 210. In this case, occurrence of damage to the wire 105 can be avoided by suppressing the movement speed of the upper mold 220. In this state, the light emitting diode 101 is in a state where it is buried in the transparent liquid resin 214, and also the release sheet 212 is in a state where it sticks to the bottom of the concave portion 211. Then, heat is applied in this state, so that the transparent resin 214 is solidified.

Figure 8C:
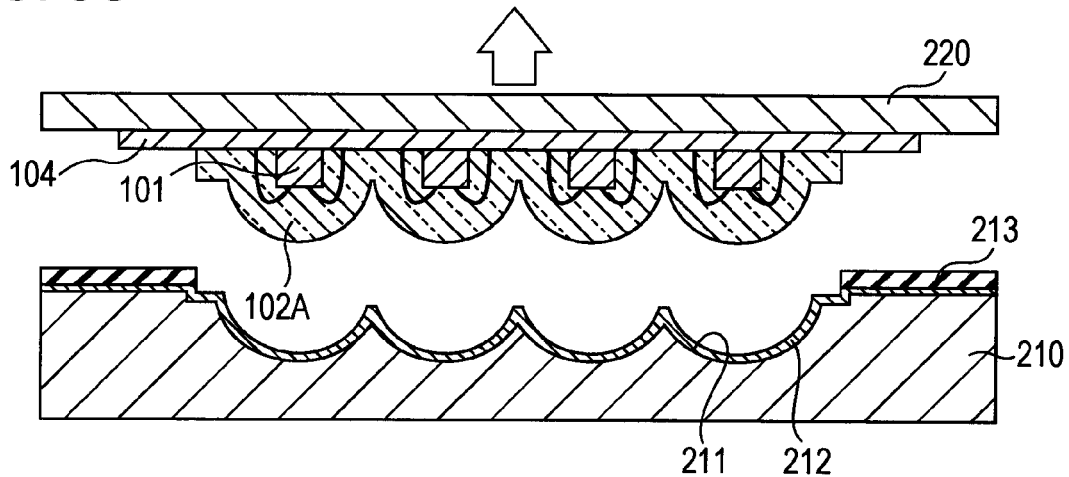

Next, as shown in FIG. 8C, the upper mold 220 is moved away from the lower mold 210. As the transparent resin 214 is solidified as described above, the transparent resin layer 102A with a dome shape is formed outside the light emitting diode 101. In this case, since the release sheet 212 is disposed between the lower mold 210 and the transparent resin layer 102A, separation of the transparent resin layer 102A from the lower mold 210 is carried out smoothly.

Returning to FIGS. 7A to 7C, as shown in FIG. 7B, the transparent resin layer 102A is formed outside the light emitting diode 101. Thereafter, as shown in FIG. 7C, the transparent resin layer 103A having the convex portion 103Aa and the thin-film portion 103Ab is formed outside the transparent resin layer 102A by a compression molding method, so that the light emitting device 100A is completed.

Figure 9A:
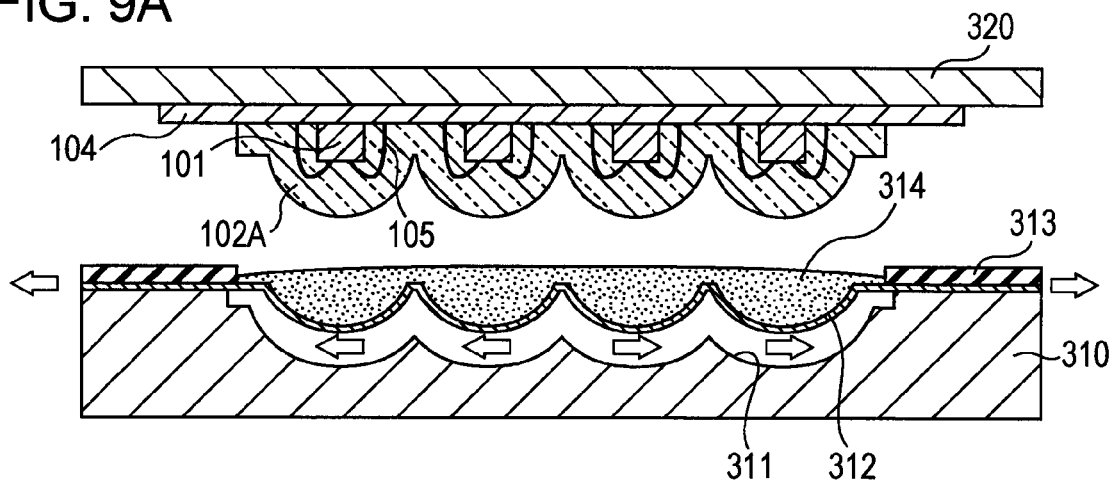
FIGS. 9A to 9C are diagrams illustrating one example of a manufacturing process of a transparent resin layer (a second layer) of the light emitting device according to the second embodiment of the invention.

One example of a manufacturing process of the transparent resin layer 103A will be described with reference to FIGS. 9A to 9C. As shown in FIG. 9A, a lower mold 310 having a concave portion 311 corresponding to the convex portion 103Aa of the transparent resin layer 103A and a flat plate-like upper mold 320 are used.

First, as shown in FIG. 9A, thermosetting transparent liquid resin (containing a phosphor) 314 is placed above the lower mold 310 with a release sheet 312 interposed therebetween. In addition, an O-ring 313 for preventing the above-described transparent liquid resin 314 from being leaked to the outside is disposed above the lower mold 310. In this state, the release sheet 312 is pulled in an outer circumference direction, as shown in an arrow, and placed in a tense state. Also, as shown in FIG. 9A, the circuit substrate 104 with the light emitting diode 101 mounted thereon is fixed to the upper mold 320. In addition, the transparent resin layer 102A remains formed outside the light emitting diode 101.

Figure 9B:
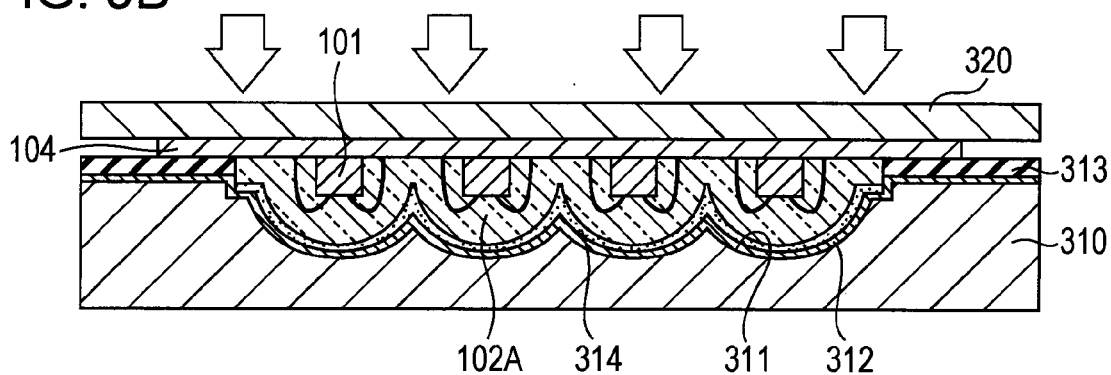

Next, as shown in FIG. 9B, the upper mold 320 is moved so as to approach the lower mold 310, so that the light emitting diode 101 mounted on the circuit substrate 104 and with its outer side covered by the transparent resin layer 102A is in a state where the light emitting diode 101 is located in the concave portion 211 of the lower mold 310. In this state, the light emitting diode 101 covered by the transparent resin layer 102A is in a state where it is buried in the transparent liquid resin 314, and also the release sheet 312 is in a state where it sticks to the bottom of the concave portion 311. Then, heat is applied in this state, so that the transparent resin 314 is solidified.

Figure 9C:
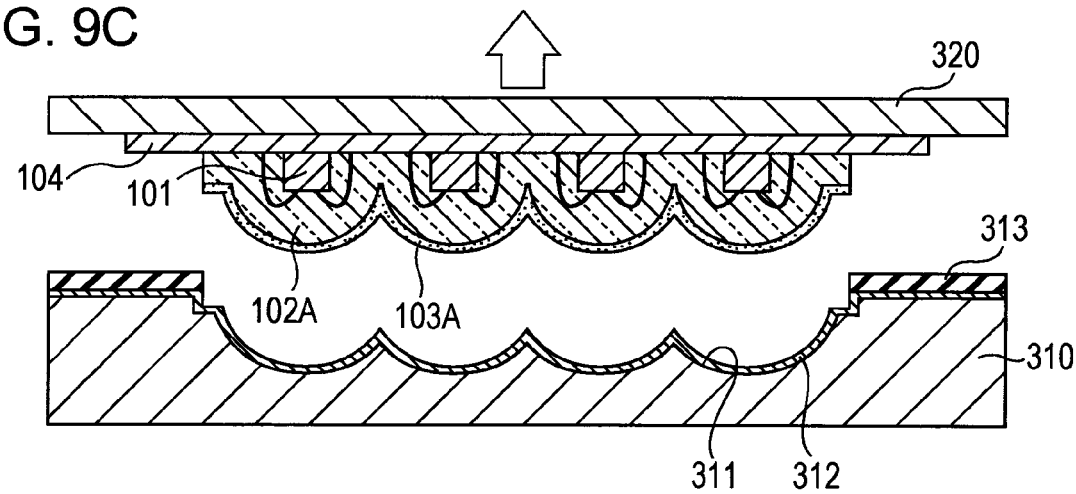

Next, as shown in FIG. 9C, the upper mold 320 is moved away from the lower mold 310. As the transparent resin 314 is solidified as described above, the transparent resin layer 103A is formed outside the transparent resin layer 102A. In this case, since the release sheet 312 is disposed between the lower mold 310 and the transparent resin layer 103A, separation of the transparent resin layer 103A from the lower mold 310 is carried out smoothly.

Figure 10:
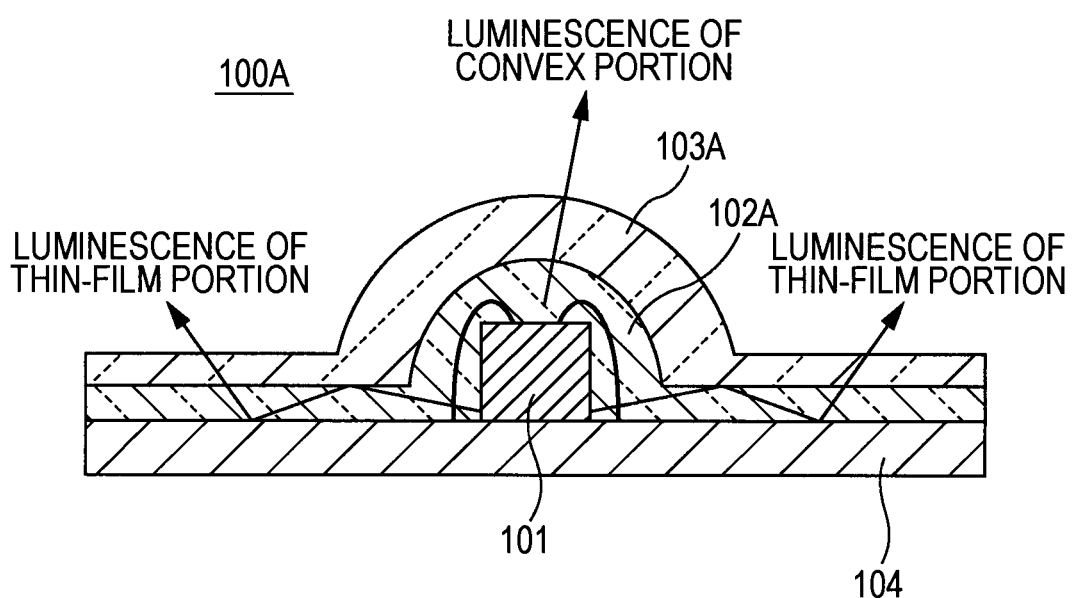
FIG. 10 is a diagram for illustrating a light output operation of the light emitting device according to the second embodiment of the invention.

In the light emitting device 100A shown in FIG. 6, as shown in FIG. 10, light is output from the convex portions and the thin-film portions of the transparent resin layers 102A and 103A which enclose the light emitting diode 101. In this case, some of light emitted from the light emitting diode 101 is output to the outside through the transparent resin layer 102A and the transparent resin layer 103A. Also, some other light emitted from the light emitting diode 101 is input to the transparent resin layer 103A through the transparent resin layer 102A, thereby exciting the phosphor in the transparent resin layer 103A.

Then, light emitted from the phosphor in the transparent resin layer 103A is output from the transparent resin layer 103A to the outside. As described above, since the light emitting diode 101 is the blue light emitting diode and the phosphor in the transparent resin layer 103A is the phosphor of a YAG system, white light can be obtained in a pseudo manner by combination of the luminescence of the light emitting diode 101 and the luminescence from the phosphor. In this case, the relationship between the refractive index N1 of the light emitting diode 101, the refractive index N2 of the transparent resin layer 102A, and the refractive index N3 of the transparent resin layer 103A is set to be the relationship of $N1 \geq N2 \geq N3 \geq 1$. For this reason, the luminescence of the light emitting diode 101 and the luminescence of the phosphor in the transparent resin layer 103A are efficiently extracted to the outside.

In the light emitting device 100A shown in FIG. 6, since the outside of the light emitting diode 101 is two layers, the manufacturing process can be simplified compared to the existing structure having three layers or more, so that a reduction in cost can be attained. Also, in the light emitting device 100A shown in FIG. 6, since the outside of the light emitting diode 101 is two layers, attenuation of light can be suppressed compared to the existing structure having three layers or more, so that it is possible to increase light extraction efficiency.

Further, in the light emitting device 100A shown in FIG. 6, light emitted from the light emitting diode 101 and light emitted from the phosphor in the transparent resin layer 103A are also output from the thin-film portion to the outside, in addition to being output from the convex portion to the outside. For this reason, light can be emitted from the entire surface and also improvement in luminance can be attained. Since the light emitting device 100A shown in FIG. 6 performs entire surface luminescence in this manner, it can be used as, for example, a light source for lighting or the like.

3. Third Embodiment

Configuration of Light Emitting Device

Figure 11:
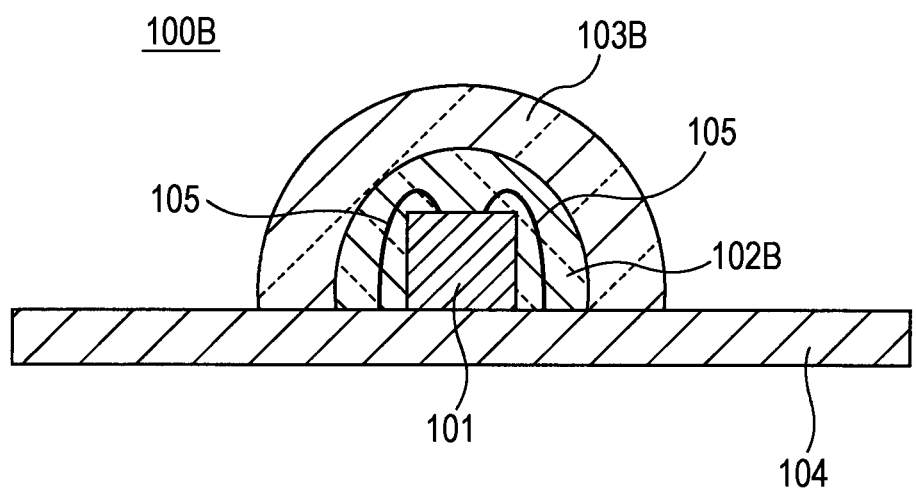
FIG. 11 is a diagram schematically illustrating a structural example of a light emitting device according to a third embodiment of the invention.

FIG. 11 shows a structural example of a light emitting device 100B according to a third embodiment. In FIG. 11, the same reference numeral is applied to a portion corresponding to that of FIG. 1 and the detailed description thereof will be appropriately omitted. The light emitting device 100B includes the light emitting diode (LED) 101 as the solid-state light-emitting element, a transparent resin layer 102B as the first resin layer, and a transparent resin layer 103B as the second resin layer.

The light emitting diode 101 is mounted on the circuit substrate 104 as the mounting substrate. The electrodes of the light emitting diode 101 are connected to conductors on the circuit substrate 104 by using the wires 105. The transparent resin layer 102B is made of transparent resin. The transparent resin layer 102B is provided outside the light emitting diode 101 so as to cover the light emitting diode 101. The transparent resin layer 102B is formed into a dome shape and constitutes a lens mechanism of a convex shape, which encloses the light emitting diode 101.

The transparent resin layer 103B is made of transparent resin that contains a phosphor which is excited with the luminescence wavelength of the light emitting diode 101. The transparent resin layer 103B is provided outside the transparent resin layer 102B so as to cover the transparent resin layer 102B. The transparent resin layer 103B is formed into a dome shape, similarly to the transparent resin layer 102B, and constitutes a lens mechanism of a convex shape, which encloses the light emitting diode 101 and the transparent resin layer 102B. In this embodiment, in order to obtain white light in a pseudo manner, for example, the light emitting diode 101 is set to be the blue light emitting diode and the phosphor is set to be the phosphor of a YAG (yttrium aluminum garnet) system.

In the light emitting device 100B shown in FIG. 11, unlike the light emitting device 100 shown in FIG. 1 described above, to a contact portion of the circuit substrate 104 with the transparent resin layers 102B and 103B, a water-repellent material is not applied. The reason is because in the light emitting device 100B, the transparent resin layers 102B and 103B are formed by a compression molding method using a mold, similarly to the transparent resin layers 102A and 103A of the light emitting device 100A of FIG. 6 described above.

In addition, in the light emitting device 100B shown in FIG. 11, the relationship between the refractive indexes of the light emitting diode 101 and the transparent resin layers 102B and 103B is set as follows. That is, when the refractive index of the light emitting diode 101 is set to be N1, the refractive index of the transparent resin layer 102B is set to be N2, and the refractive index of the transparent resin layer 103B is set to be N3, the relationship is set so as to satisfy the relationship of $N1 \geq N2 \geq N3 \geq 1$.

Manufacturing Method of Light Emitting Device

Figure 12A:
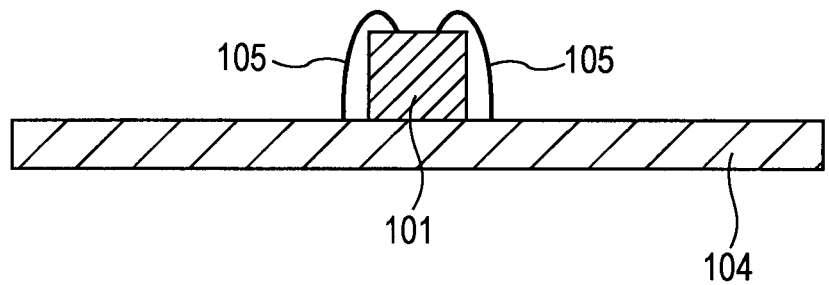
FIGS. 12A to 12C are diagrams for illustrating a manufacturing process of the light emitting device according to the third embodiment of the invention.
Figure 12B:
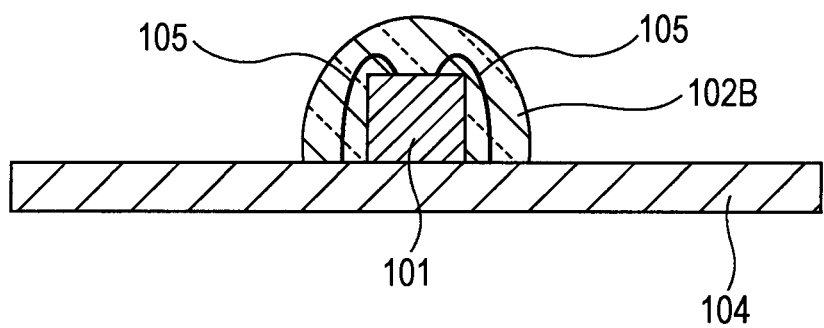

A manufacturing process of the light emitting device 100B shown in FIG. 11 will be described with reference to FIGS. 12A to 12C. First, as shown in FIG. 12A, the circuit substrate 104 with the light emitting diode 101 mounted thereon is prepared. Next, as shown in FIG. 12B, the transparent resin layer 102B with a dome shape is formed outside the light emitting diode 101 by a compression molding method. Although the detailed explanation is omitted, manufacturing of the transparent resin layer 102B is carried out by, for example, the same process as the manufacturing process of the transparent resin layer 102A in the light emitting device 100A shown in FIG. 6 described above (refer to FIGS. 8A to 8C).

Figure 12C:
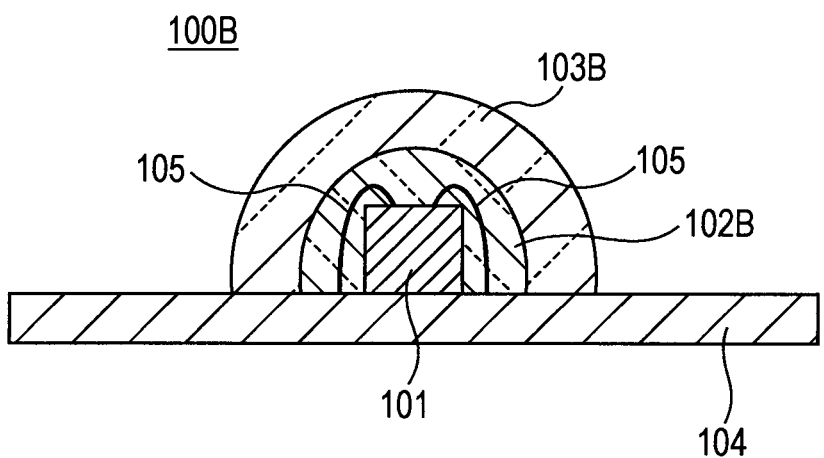

Next, as shown in FIG. 12C, the transparent resin layer 103B with a dome shape is formed outside the transparent resin layer 102B by a compression molding method, so that the light emitting device 100B is completed. Although the detailed explanation is omitted, manufacturing of the transparent resin layer 103B is carried out by, for example, the same process as the manufacturing process of the transparent resin layer 103A in the light emitting device 100A shown in FIG. 6 described above (refer to FIGS. 9A to 9C).

Figure 13:
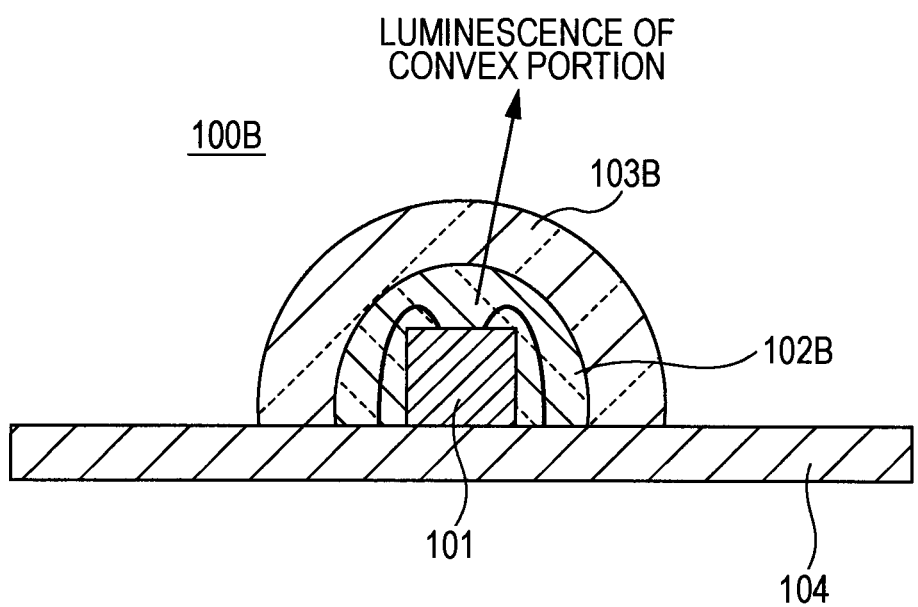
FIG. 13 is a diagram for illustrating a light output operation of the light emitting device according to the third embodiment of the invention.

In the light emitting device 100B shown in FIG. 11, as shown in FIG. 13, light is output from convex portions of the transparent resin layers 102B and 103B which enclose the light emitting diode 101. In this case, some of light emitted from the light emitting diode 101 is output to the outside through the transparent resin layer 102B and the transparent resin layer 103B. Also, some other light emitted from the light emitting diode 101 is input to the transparent resin layer 103B through the transparent resin layer 102B, thereby exciting the phosphor in the transparent resin layer 103B.

Then, light emitted from the phosphor in the transparent resin layer 103B is output from the transparent resin layer 103B to the outside. As described above, since the light emitting diode 101 is the blue light emitting diode and the phosphor in the transparent resin layer 103B is the phosphor of a YAG system, white light can be obtained in a pseudo manner by combination of the luminescence of the light emitting diode 101 and the luminescence from the phosphor. In this case, the relationship between the refractive index N1 of the light emitting diode 101, the refractive index N2 of the transparent resin layer 102B, and the refractive index N3 of the transparent resin layer 103B is set to be the relationship of $N1 \geq N2 \geq N3 \geq 1$. For this reason, the luminescence of the light emitting diode 101 and the luminescence of the phosphor in the transparent resin layer 103B are efficiently extracted to the outside.

In the light emitting device 100B shown in FIG. 11, since the outside of the light emitting diode 101 is two layers, the manufacturing process can be simplified compared to the existing structure having three layers or more, so that a reduction in cost can be attained. Also, in the light emitting device 100B shown in FIG. 11, since the outside of the light emitting diode 101 is two layers, attenuation of light can be suppressed compared to the existing structure having three layers or more, so that it is possible to increase light extraction efficiency. Since the light emitting device 100B shown in FIG. 11 emits light only from the convex portion, as described above, it can be used as, for example, a light source for a backlight of a liquid crystal display device, or the like.

4. Fourth Embodiment

Configuration of Light Emitting Device

Figure 14:
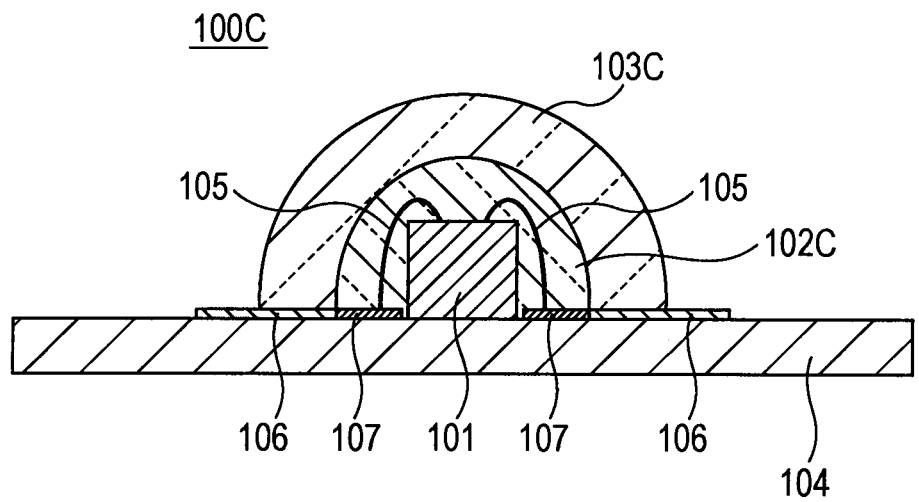
FIG. 14 is a diagram schematically illustrating a structural example of a light emitting device according to a fourth embodiment of the invention.

FIG. 14 shows a structural example of a light emitting device 100C according to a fourth embodiment. In FIG. 14, the same reference numeral is applied to a portion corresponding to that of FIG. 1 and the detailed description thereof will be appropriately omitted. The light emitting device 100C includes the light emitting diode (LED) 101 as the solid-state light-emitting element, a transparent resin layer 102C as the first resin layer, a transparent resin layer 103C as the second resin layer, and a transparent resin thin-film portion 107 as a thin-film portion.

The light emitting diode 101 is mounted on the circuit substrate 104 as the mounting substrate. The electrodes of the light emitting diode 101 are connected to conductors on the circuit substrate 104 by using the wires 105. The transparent resin layer 102C is made of transparent resin. The transparent resin layer 102C is provided outside the light emitting diode 101 so as to cover the light emitting diode 101. The transparent resin layer 102C is formed into a dome shape and constitutes a lens mechanism of a convex shape, which encloses the light emitting diode 101.

The transparent resin layer 103C is made of transparent resin that contains a phosphor which is excited with the luminescence wavelength of the light emitting diode 101. The transparent resin layer 103C is provided outside the transparent resin layer 102C so as to cover the transparent resin layer 102C. The transparent resin layer 103C is formed into a dome shape, similarly to the transparent resin layer 102C, and constitutes a lens mechanism of a convex shape, which encloses the light emitting diode 101 and the transparent resin layer 102C. In this embodiment, in order to obtain white light in a pseudo manner, for example, the light emitting diode 101 is set to be the blue light emitting diode and the phosphor is set to be a phosphor of the YAG (yttrium aluminum garnet) system.

To a contact portion of the circuit substrate 104 with the above-described transparent resin layer 103C, the water-repellent material 106 is applied. The water-repellent material 106 contains, for example, fluorine as its constituent. As will be described later, in the light emitting device 100C, the transparent resin layer 103C is formed by a potting method. The water-repellent material 106 is applied in order to secure formability of the transparent resin layer 103C.

Also, the transparent resin thin-film portion 107 is provided corresponding to a portion or the entirety (in the fourth embodiment, a portion) between the circuit substrate 104 and the transparent resin layer 102C. The transparent resin thin-film portion 107 is made of transparent resin that contains a phosphor which is excited with the luminescence wavelength of the light emitting diode 101, similarly to the above-described transparent resin layer 103C. As will be described later, the transparent resin thin-film portion 107 is formed by, for example, a printing method.

In addition, in the light emitting device 100C shown in FIG. 14, the relationship between the refractive indexes of the light emitting diode 101 and the transparent resin layers 102C and 103C is set as follows. That is, when the refractive index of the light emitting diode 101 is set to be N1, the refractive index of the transparent resin layer 102C is set to be N2, and the refractive index of the transparent resin layer 103C is set to be N3, the relationship is set so as to satisfy the relationship of $N1 \geq N2 \geq N3 \geq 1$.

Manufacturing Method of Light Emitting Device

Figure 15A:
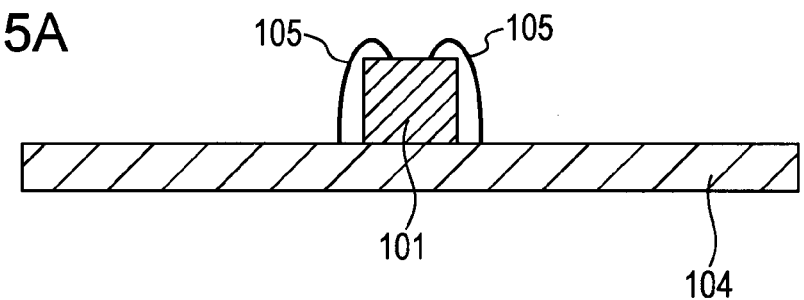
FIGS. 15A to 15E are diagrams for illustrating a manufacturing process of the light emitting device according to the fourth embodiment of the invention.
Figure 15B:
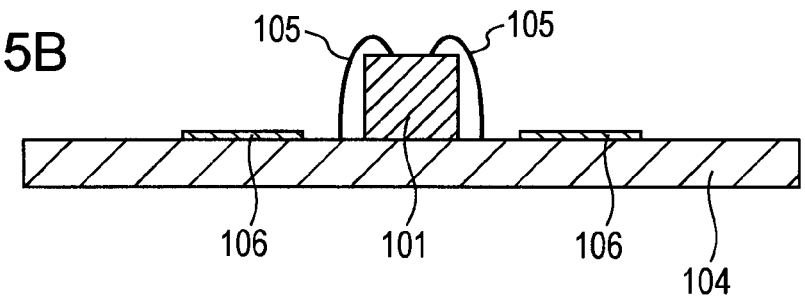

A manufacturing process of the light emitting device 100C shown in FIG. 14 will be described with reference to FIGS. 15A to 15E. First, as shown in FIG. 15A, the circuit substrate 104 with the light emitting diode 101 mounted thereon is prepared. Next, as shown in FIG. 15B, for example, by a printing method, the water-repellent material 106 is applied to the surface of the circuit substrate 104, on which the light emitting diode 101 is mounted, so as to surround the light emitting diode 101. In this case, although illustration is omitted, the applied area of the water-repellent material 106 becomes, for example, a doughnut-shaped region centered on the light emitting diode 101.

Figure 15C:
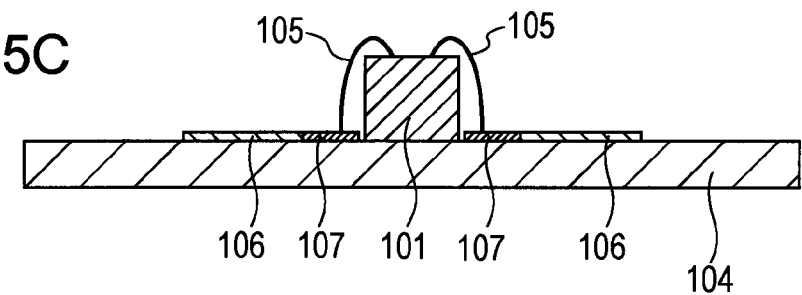

Next, as shown in FIG. 15C, for example, by a printing method, transparent resin is applied to the surface of the circuit substrate 104, on which the light emitting diode 101 is mounted, so as to surround the light emitting diode 101. In this case, although illustration is omitted, the applied area of the transparent resin becomes, for example, a doughnut-shaped region centered on the light emitting diode 101 inside the applied area of the water-repellent material 106. As a result, the transparent resin thin-film portion 107 is formed on the circuit substrate 104.

Figure 15D:
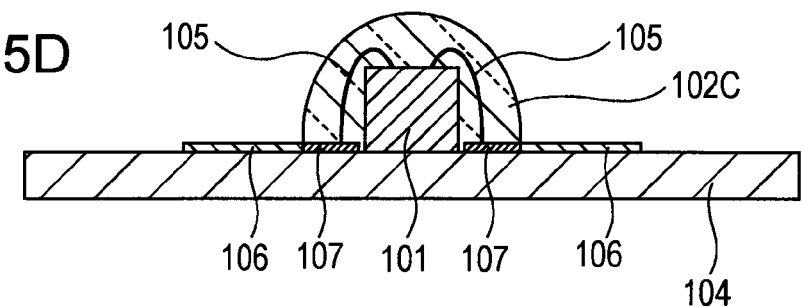

Next, as shown in FIG. 15D, transparent resin is applied outside the light emitting diode 101. In this case, the transparent resin is shaped into a polka dot shape due to the water repellent effect of the water-repellent material 106. The transparent resin is, for example, a thermosetting resin and is solidified by application of heat. As a result, the transparent resin layer 102C with a dome shape, which constitutes a lens mechanism of a convex shape, is formed outside the light emitting diode 101.

Figure 15E:
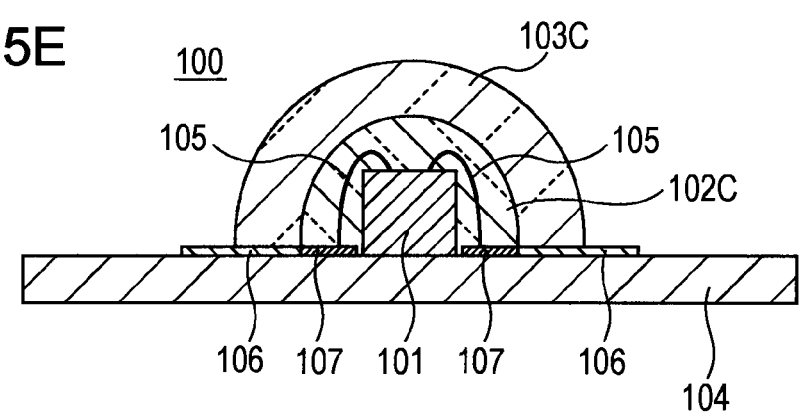

Next, as shown in FIG. 15E, transparent resin that contains a phosphor which is excited with the luminescence wavelength of the light emitting diode 101 is applied outside the transparent resin layer 102C. In this case, the transparent resin is shaped into a polka dot shape due to the water repellent effect of the water-repellent material 106. The transparent resin is, for example, a thermosetting resin and is solidified by application of heat. As a result, the transparent resin layer 103C with a dome shape, which constitutes a lens mechanism of a convex shape, is formed outside the transparent resin layer 102C, so that the light emitting device 100C is completed.

In the light emitting device 100C shown in FIG. 14, since it has the same structure as that of the light emitting device 100 shown in FIG. 1, the manufacturing process can be simplified, so that a reduction in cost can be attained, and it is possible to increase light extraction efficiency. Further, in the light emitting device 100C shown in FIG. 14, since the transparent resin thin-film portion 107 is provided, improvement in luminance can be attained.

That is, of light emitted from the light emitting diode 101, light toward the circuit substrate 104 is input to the transparent resin thin-film portion 107 through the transparent resin layer 102C, so that the phosphor in the transparent resin thin-film portion 107 is excited. Then, some of light emitted from the phosphor is output to the outside through the transparent resin layer 102C and the transparent resin layer 103C. For this reason, luminance is improved more than the light emitting device 100 shown in FIG. 1.

5. Modified Example

In addition, in the above-described embodiments, in order to obtain white light in a pseudo manner, the light emitting diode 101 is set to be the blue light emitting diode and the phosphor in each of the transparent resin layers 103, 103A, and 103B is set to be the phosphor of a YAG system. However, the invention is not limited thereto. That is, the light emitting diode 101 is not limited to the blue light emitting diode. Also, the phosphor which is excited with the luminescence wavelength of the light emitting diode 101 is not limited to the phosphor of a YAG system. For example, other phosphors such as a phosphor of a silicate system may be used.

Also, in the above-described embodiments, a case where the solid-state light-emitting element is the light emitting diode has been illustrated. However, it is a matter of course that the invention can also be similarly applied to the case of using elements other than the light emitting diode as the solid-state light-emitting element.

The present application contains subject matters related to those disclosed in Japanese Priority Patent Application JP 2010-026580 filed in the Japan Patent Office on Feb. 9, 2010 and Japanese Priority Patent Application JP 2010-274283 filed in the Japan Patent Office on Dec. 9, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
a first resin layer which is made of transparent resin and provided outside a solid-state light-emitting element mounted directly on a mounting substrate; and
a second resin layer which is provided outside the first resin layer and made of transparent resin that contains a first phosphor which is excited with a luminescence wavelength of the solid-state light-emitting element,
wherein when the refractive index of the solid-state light-emitting element is set to be N1, the refractive index of the first resin layer is set to be N2, and the refractive index of the second resin layer is set to be N3, the relationship of N1≥N2≥N3≥1 is established; and
a thin-film layer which is provided between the mounting substrate and the first resin layer,
wherein the thin-film layer comprises a transparent resin and a second phosphor which is excited with the luminescence wavelength of the solid-state light-emitting element,
wherein the thin-film layer is structured to permit at least a portion of the solid-state light-emitting element to be in direct contact with the first resin layer, and
wherein the first resin layer and the second resin layer each comprise:
a dome-shaped convex portion which encloses the solid-state light-emitting element; and
a thin-film portion which is connected to the dome-shaped convex portion and located around the dome-shaped convex portion.

2. The light emitting device according to claim 1, wherein the solid-state light-emitting element is a light emitting diode.

3. The light emitting device according to claim 2, wherein:
the light emitting diode is a blue light emitting diode;
at least one of the first phosphor or the second phosphor comprises a phosphor material which is excited with a luminescence wavelength of the blue light emitting diode; and
white light is obtained in a pseudo manner by combination of luminescence of the light emitting diode and luminescence of the phosphor material.

* * * * *